United States Patent
Hong et al.

(10) Patent No.: US 7,593,282 B2
(45) Date of Patent: Sep. 22, 2009

(54) MEMORY CORE WITH SINGLE CONTACTS AND SEMICONDUCTOR MEMORY DEVICE HAVING THE SAME

(75) Inventors: Sang-Pyo Hong, Yongin-si (KR); Jung-Hwa Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 255 days.

(21) Appl. No.: 11/590,313

(22) Filed: Oct. 31, 2006

(65) Prior Publication Data

US 2007/0109904 A1    May 17, 2007

(30) Foreign Application Priority Data

Nov. 11, 2005    (KR) ...................... 10-2005-0108102

(51) Int. Cl.
*G11C 8/00* (2006.01)
(52) U.S. Cl. .................... 365/230.03; 365/63; 365/203; 365/205; 365/230.06
(58) Field of Classification Search ................. 365/203, 365/205, 230.03, 230.06, 63
See application file for complete search history.

(56) References Cited

U.S. PATENT DOCUMENTS

| | | | | |
|---|---|---|---|---|
| 5,590,080 | A | * 12/1996 | Hasagawa et al. | ............ 365/201 |
| 5,867,434 | A | 2/1999 | Oh et al. | |
| 6,205,071 | B1 * | 3/2001 | Ooishi | ........................ 365/207 |
| 6,376,298 | B1 * | 4/2002 | Li et al. | ...................... 438/238 |
| 6,521,960 | B2 | 2/2003 | Lee | |

FOREIGN PATENT DOCUMENTS

| | | |
|---|---|---|
| JP | 5251660 | 9/1993 |
| JP | 8293587 | 5/1996 |
| KR | 1019980026622 | 7/1998 |
| KR | 1020010058931 A | 6/2001 |

* cited by examiner

*Primary Examiner*—Hoai V Ho
(74) *Attorney, Agent, or Firm*—Mills & Onello LLP

(57) ABSTRACT

A memory core includes a first sub-memory array including a plurality of first memory cells, a second sub-memory array including a plurality of second memory cells, a bit line amplification circuit configured to amplify a voltage difference between the first bit line and the second bit line, and a column selection circuit including a first column selection transistor and a second column selection transistor, wherein the first and the second selection transistors share a drain and electrically couple the complementary bit line pair to a complementary local input/output line pair, respectively. As a result, the data error due to the distance mismatching can be reduced.

6 Claims, 7 Drawing Sheets

MEMORY CORE WITH SINGLE CONTACTS AND SEMICONDUCTOR MEMORY DEVICE HAVING THE SAME

CROSS-REFERENCE TO RELATED APPLICATIONS

This application claims priority under 35 U.S.C. §119 to commonly owned Korean Patent Application No. 10-2005-0108102 filed on Nov. 11, 2005, the contents of which are herein incorporated by reference in its entirety.

BACKGROUND OF THE INVENTION

1. Field of the Invention

The present invention relates to a semiconductor memory device employing an open bit line architecture, and more particularly, to a semiconductor memory device for reducing a data error due to a distance mismatching.

2. Description of the Related Art

A semiconductor memory device is a device for storing a data into a memory cell and for outputting the data stored from the memory cell. The semiconductor memory device can include a memory core for storing/outputting the data into/from a memory cell and a peripheral device for supporting an interface between the semiconductor memory device and a control unit, such as a central processing unit (CPU).

The memory core structures, which are widely used today, can include a folded bit line architecture and an open bit line architecture. The open bit line architecture is a configuration in which bit line amplification circuits are formed between a bit line pair (BL and BLB), and the folded bit line architecture is a configuration in which the bit line pair (BL and BLB) are formed side by side on one side of the bit line amplification circuits.

In the open bit line architecture, the memory cell is arranged at an intersection where a word line WL crosses a bit line BL. Compared to the folded bit line architecture, the open bit line architecture has a greater density and a reduced cell area.

FIG. 1 is a circuit diagram illustrating a conventional memory core employing an open bit line architecture in a general dynamic random access memory (DRAM) device.

Referring to FIG. 1, the memory core includes a bit line amplification circuit 10, a first column selection transistor 20, a second column selection transistor 30, a first memory cell 40 and a second memory cell 50.

A bit line pair (BL and BLB) is respectively coupled to the first memory cell 40 and the second memory cell 50, and the bit line amplification circuit 10 is coupled between the bit line pair (BL and BLB).

The bit line amplification circuit 10 includes a P-type sense amplifier 12, an N-type sense amplifier 14 and an equalization circuit 16.

The equalization circuit 16 pre-charges the bit line pair (BL and BLB) with a first predetermined voltage VBL.

The P-type sense amplifier 12 charges the bit line pair (BL and BLB) with a second predetermined voltage VCL and the N-type sense amplifier 14 charges the bit line pair (BL and BLB) with a third predetermined voltage VSS.

For example, the first predetermined voltage VBL can be a half of the second predetermined voltage VCL. The second predetermined voltage VCL can be a power voltage and the third predetermined voltage VSS can be a ground voltage.

The column selection transistors 20 and 30 electrically couple the bit line pair (BL and BLB) to local input/output lines (LD and LDB) in response to a column selection signal CSL, respectively. Namely, the first column selection transistor 20 electrically couples the bit line BL to the local input/output line LD in response to the column selection signal CSL, and the second column selection transistor 30 electrically couples the bar bit line BLB to a bar local input/output line LDB in response to the column selection signal CSL.

As illustrated in FIG. 1, the first column selection transistor 20 is arranged in a left side of the bit line amplification circuit 10 and the second column selection transistor 30 is arranged in a right side of the bit line amplification circuit 10.

However, the P-type sense amplifier 12 and the N-type sense amplifier 14 include a much larger transistor than the respective column selection transistors 20 and 30 and occupy a large area of a semiconductor memory device.

Therefore, a distance between the first column selection transistor 20 and the P-type sense amplifier 12 is much longer than that between the second column selection transistor 30 and the P-type sense amplifier 12. Namely, a distance from the local input/output line LD to the P-type sense amplifier 12 is much longer than that from the bar local input/output line LDB to the P-type sense amplifier 12.

As a result, when the data is inputted to or outputted from the memory cells 40 and 50, a data error due to a distance mismatching can occur. That is, because a distance between a memory cell and a respective column selection transistor pair 20 and 30 mismatches, the data error can result.

FIG. 2 is a conventional layout diagram illustrating a memory core in the semiconductor memory device in FIG. 1.

Referring to FIG. 2, the memory core includes an N+ doped layer 1, a gate poly layer 2, a direct contact layer 4, and a bit line poly layer 5. The memory core further includes a bit line amplification circuit 10, column selection transistors TR1 through TR4, and first to sixteenth contacts CON1 through CON16. The memory core employs the open bit line architecture with a first bit line pair BL1 and BL1B and a second bit line pair BL2 and BL2B.

In FIG. 2, a first column selection transistor TR1 and a second column selection transistor TR2 are arranged in a left side of the bit line amplification circuit 10, and a third column selection transistor TR3 and a fourth column selection transistor TR4 are arranged in a right side of the bit line amplification circuit 10.

The first column selection transistor TR1 and the third column selection transistor TR3 electrically couple the first bit line pair BL1 and BL1B to the first local input/output line pair LD1 and LD1B, respectively, in response to the column selection signal CSL. That is, the first column selection transistor TR1 electrically couples the first bit line BL1 to the first local input/output line LD1 in response to the column selection signal CSL and the third column selection transistor TR3 electrically couples the first bar bit line BL1B to the first bar local input/output line LD1B in response to the column selection signal CSL.

The first contact CON1 and the second contact CON2 indicate a source contact of the first column selection transistor TR1, and the third contact CON3 and the fourth contact CON4 indicate a drain contact of the first column selection transistor TR1. The fifth contact CON5 and the sixth contact CON6 indicate a source contact of the second column selection transistor TR2, and the seventh contact CON7 and the eighth contact CON8 indicate a drain contact of the second column selection transistor TR2. The ninth contact CON9 and the tenth contact CON10 indicate a source contact of the third column selection transistor TR3, and the eleventh contact CON11 and the twelfth contact CON12 indicate a drain contact of the third column selection transistor TR3. The thirteenth contact CON13 and the fourteenth contact CON14 indicate a source contact of the fourth column selection transistor TR4, and the fifteenth contact CON15 and the sixteenth contact CON16 indicate a drain contact of the fourth column selection transistor TR4.

A cell pitch can be defined as a distance between the drain of the first column selection transistor TR1 and the drain of the second column selection transistor TR2. In FIG. 2, the first and second bit line pairs BL1 and BL1B, and BL2 and BL2B can not be arranged within the cell pitch. Therefore, the distance between the first column selection transistor TR1 and the bit line amplification circuit, and the distance between the third column selection transistor TR3 and the bit line amplification circuit 10 are not equivalent to each other.

For example, the distance between the first column selection transistor TR1 and the bit line amplification circuit 10 coupled to the first bit line BL1 can be greater than that between the third column selection transistor TR3 and the bit line amplification circuit 10 coupled to the first bar bit line BL1B. As a result, the data error can occur because a distance between a memory cell and a respective column selection transistor pair TR1 and TR3 mismatches.

SUMMARY OF THE INVENTION

In accordance with some aspects of the present invention, provided is a memory core employing an open bit line architecture for reducing the data error due to the distance mismatching.

In accordance with other aspects of the present invention, provided is a semiconductor memory device including a memory core for reducing the data error due to the distance mismatching.

In accordance with one aspect of the present invention, a memory core employing an open bit line architecture includes a plurality of first bit lines; a plurality of second bit lines, the second bit lines having a complementary relationship with the first bit lines; a first sub-memory array having a plurality of first memory cells configured to output first data into the first bit lines in response to a word line control signal; a second sub-memory array having a plurality of second memory cells configured to output second data into the second bit lines in response to the word line control signal, the second data having a complementary relationship with the first data; a bit line amplification circuit configured to amplify the first data on the first bit lines and the second data on the second bit lines; and a column selection circuit configured to electrically couple the first bit lines to a first input/output line in response to a column selection signal and configured to electrically couple the second bit lines to a second input/output line having a complementary relationship with the first input/output line, the column selection circuit being arranged between the bit line amplification circuit and the first sub-memory array.

The column selection circuit can include a first column selection transistor configured to electrically couple one of the first bit lines to the first input/output line; and a second column selection transistor configured to electrically couple one of the second bit lines to the second input/output line.

In the first and second column selection transistors, a self-aligned contact (SAC) poly layer can be formed on substantially a whole surface of a drain area of the first and second column selection transistors.

The first and second column selection transistors can include a single contact on a source area of the first and second column selection transistors and a single contact on a drain area of the first and second column selection transistors.

The bit line amplification circuit can include a P-type sense amplifier configured to charge the first and second bit lines with a high power voltage; and an N-type sense amplifier configured to charge the first and second bit lines with a low power voltage.

The bit line amplification circuit can further include an equalization circuit configured to pre-charge and equalize the first and second bit lines.

In accordance with another aspect of the present invention, a memory core employing an open bit line architecture includes a plurality of first bit lines; a plurality of second bit lines, the second bit lines having a complementary relationship with the first bit lines; a first sub-memory array having a plurality of first memory cells configured to output first data into the first bit lines in response to a word line control signal; a second sub-memory array having a plurality of second memory cells configured to output second data into the second bit lines in response to the word line control signal, the second data having a complementary relationship with the first data; a bit line amplification circuit configured to amplify the first data on the first bit lines and the second data on the second bit lines; and a column selection circuit configured to electrically couple the first bit lines to a first input/output line in response to a column selection signal and configured to electrically couple the second bit lines to a second input/output line having a complementary relationship with the first input/output line, the column selection circuit being arranged between the bit line amplification circuit and the second sub-memory array.

The column selection circuit can include a first column selection transistor configured to electrically couple one of the first bit lines to the first input/output line; and a second column selection transistor configured to electrically couple one of the second bit lines to the second input/output line.

In the first and second column selection transistors, a self-aligned contact (SAC) poly layer can be formed on substantially a whole surface of a drain area of the first and second column selection transistors.

The first and second column selection transistors can include a single contact on a source area of the first and second column selection transistors and a single contact on a drain area of the first and second column selection transistors.

The bit line amplification circuit can include a P-type sense amplifier configured to charge the first and second bit lines with a high power voltage; and an N-type sense amplifier configured to charge the first and second bit lines with a low power voltage.

The bit line amplification circuit can further include an equalization circuit configured to pre-charge and equalize the first and second bit lines.

In accordance with another aspect of the present invention, a semiconductor memory device includes a memory core configured to amplify data stored into a memory cell, to output the amplified data into a local input/output line, and to store the data on the local input/output line, wherein the memory core comprises: a plurality of first bit lines; a plurality of second bit lines, the second bit lines having a complementary relationship with the first bit lines; a first sub-memory array having a plurality of first memory cells configured to output first data into the first bit lines in response to a word line control signal; a second sub-memory array having a plurality of second memory cells configured to output second data into the second bit lines in response to the word line control signal, the second data having a complementary relationship with the first data; a bit line amplification circuit configured to amplify the first data on the first bit lines and the second data on the second bit lines; and a column selection circuit configured to electrically couple the first bit lines to a first input/output line in response to a column selection signal and configured to electrically couple the second bit lines to a second input/output line having a complementary relationship with the first input/output line, the column selection circuit being arranged between the bit line amplification circuit and the first sub-memory array or being arranged between the bit line amplification circuit and the second sub-memory array. And the semiconductor memory devices further includes a local sense amplifier configured to amplify the data outputted from the memory core to output the amplified data by the local sense amplifier The column selection circuit can include a first column selection transistor configured to electrically couple one of the first bit lines to the first input/output line; and a second column selection transistor configured to electrically couple one of the second bit lines to the second input/output line.

In the first and second column selection transistors, a self-aligned contact (SAC) poly layer can be formed on substantially a whole surface of a drain area of the first and second column selection transistors.

The first and second column selection transistors can include a single contact on a source area of the first and second column selection transistors and a single contact on a drain area of the first and second column selection transistors.

In accordance with still another aspect of the present invention, a memory core employing an open bit line architecture includes: a first sub-memory array including a plurality of first memory cells configured to output a first data to a first bit line among a complimentary bit line pair and a reference voltage to a second bit line among the complimentary bit line pair; a second sub-memory array including a plurality of second memory cells configured to output a second data to the second bit line and the reference voltage to the first bit line, a bit line amplification circuit configured to amplify a voltage difference between the first bit line and the second bit line; and a column selection circuit including a first column selection transistor and a second column selection transistor, wherein the first and the second selection transistor share a drain and electrically couple the complementary bit line pair to a complementary local input/output line pair.

For example, the column selection transistor can be arranged between the first sub-memory array and the bit line amplification circuit or between the second memory array and the bit line amplification circuit.

The column selection circuit can include a self-aligned contact poly that is formed on the drain of the first and the second column selection transistors.

The column selection circuit can further include a direct contact, a first bit line poly and a second bit line poly, the first bit line poly being formed on the direct contact and the second bit line poly being formed on the self-aligned contact poly and independent of the direct contact.

The bit line amplification circuit can include a P-type sense amplifier configured to charge the first and the second bit lines with a first power voltage, and an N-type sense amplifier configured to charge the first and the second bit lines with a second power voltage.

For example, the first power voltage can correspond to a power voltage and the second power voltage can correspond to a ground voltage.

The bit line amplification circuit can further include an equalization circuit that pre-charges and equalizes the first bit lines and the second bit lines.

In accordance with yet another aspect of the present invention, a semiconductor memory device includes a memory core configured to store a data on the local input/output line into a memory cell and configured to output the data within the memory cell to the local input/output line. The memory core includes: a first sub-memory array including a plurality of first memory cells configured to output a first data to a first bit line among a complimentary bit line pair and a reference voltage to a second bit line among the complimentary bit line pair; a second sub-memory array including a plurality of second memory cells configured to output a second data to the second bit line and the reference voltage to the first bit line, a bit line amplification circuit configured to amplify a voltage difference between the first bit line and the second bit line; and a column selection circuit including a first column selection transistor and a second column selection transistor, wherein the first and the second selection transistor share a drain and electrically couple the complementary bit line pair to a complementary local input/output line pair.

For example, the column selection transistor can be arranged between the first sub-memory array and the bit line amplification circuit or between the second memory array and the bit line amplification circuit.

The column selection circuit can include a self-aligned contact poly that is formed on the drain of the first and the second column selection transistors.

The column selection circuit can further include a direct contact, a first bit line poly and a second bit line poly, the first bit line poly being formed on the direct contact, and the second bit line poly being formed on the self-aligned contact poly independent of the direct contact.

The bit line amplification circuit can include a P-type sense amplifier configured to charge the first and the second bit lines with a first power voltage and an N-type sense amplifier configured to charge the first and the second bit lines with a second power voltage.

For example, the first power voltage can correspond to a power voltage and the second power voltage can correspond to a ground voltage.

The bit line amplification circuit can further include an equalization circuit that pre-charges and equalizes the first bit lines and the second bit lines.

The semiconductor memory device can further include a local sense amplifier configured to amplify the outputted data on the local input/output line.

BRIEF DESCRIPTION OF THE DRAWINGS

Various aspects of the invention will become more apparent in view of the attached drawing figures, which are provided by way of example, not by way of limitation, in which.

DESCRIPTION OF THE EMBODIMENTS

Figure 1:
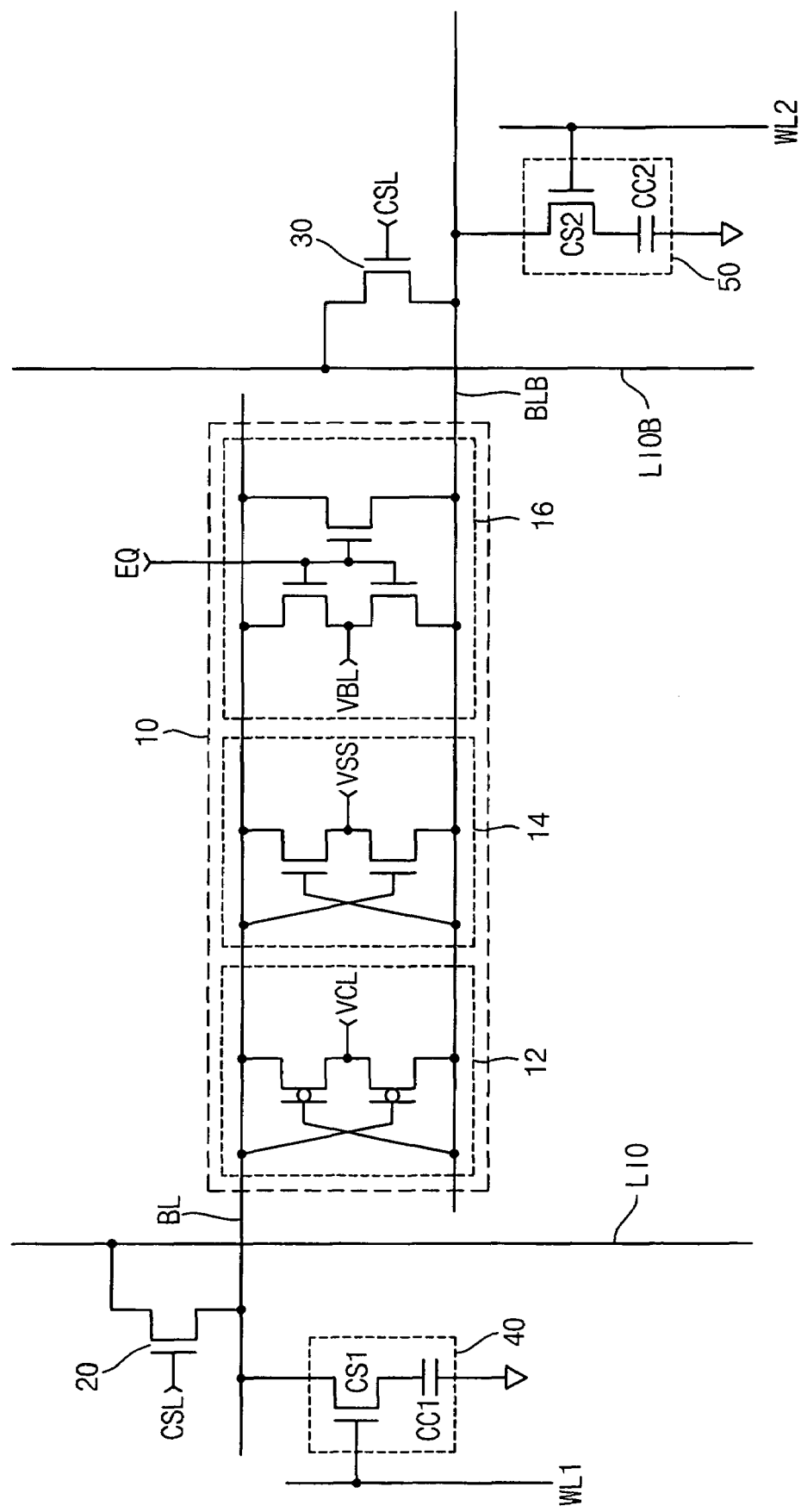
FIG. 1 is a circuit diagram illustrating a conventional memory core employing an open bit line architecture in a general dynamic random access memory (DRAM) device.

Detailed illustrative example embodiments of the present invention are disclosed herein. However, specific structural and functional details disclosed herein are merely representative for purposes of describing example embodiments of the present invention. This invention can be embodied in many alternate forms and should not be construed as limited to the example embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. can be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on," "connected" or "coupled" to another element, it can be directly on, connected or coupled to the other element or intervening elements can be present. In contrast, when an element is referred to as being "directly on," "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 3:
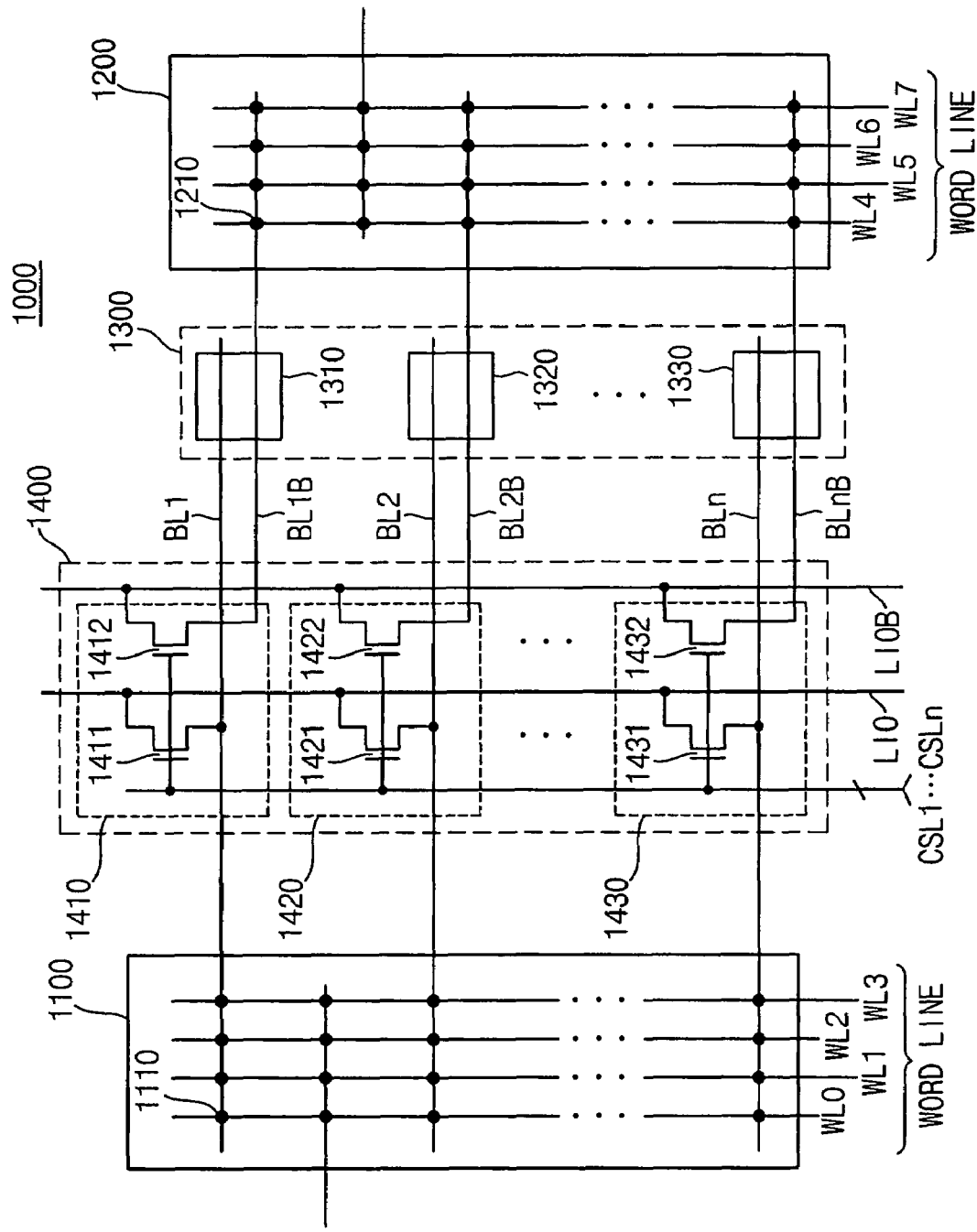
FIG. 3 is a circuit diagram illustrating an example embodiment of memory core of a DRAM device employing an open bit line architecture according to aspects of the present invention.

FIG. 3 is a circuit diagram illustrating an example embodiment of a memory core of a DRAM device employing an open bit line architecture according to the present disclosure.

Referring to FIG. 3, a memory core 1000 includes a first sub-memory array 1100, a second sub-memory array 1200, a bit line amplification unit 1300 and a column selection unit 1400.

The first sub-memory array 1100 is coupled to bit lines BL (i.e. BL1, BL2, . . . , and BLn) and the second sub-memory array 1200 is coupled to bar bit lines BLB (i.e. BLB1, BLB2, . . . , and BLBn). The bit line amplification unit 1300 is coupled between the bit line pair BL and BLB.

Memory cells are arranged in intersection points between the bit lines BL and word lines of the first sub-memory array 1100 and between the bar bit lines BLB and word lines of the second sub-memory array 1200. For example, the first memory cell 1110 is arranged in the intersection point between the word line WL0 and the bit line BL1, and the second memory cell 1210 is arranged in the intersection point between the word line WL4 and the bar bit line BL1B.

The bit line amplification unit 1300 includes first, second and third bit line amplification circuits 1310, 1320 and 1330. For example, the bit line amplification circuit 1310 respectively amplifies signals on the first bit line pair BL1 and BL1B. The bit line amplification circuit 1320 respectively amplifies signals on the second bit line pair BL2 and BL2B. And the bit line amplification circuit 1330 respectively amplifies signals on the n-th bit line pair BLn and BLBn.

The column selection unit 1400 includes first, second and third column selection circuits 1410 through 1430. The first column selection circuit 1410 includes column selection transistors 1411 and 1412, the second column selection circuit 1420 includes column selection transistors 1421 and 1422, and the third column selection circuit 1430 includes column selection transistors 1431 and 1432.

The first column selection transistor pair 1411 and 1412 includes gates to which a column selection signal CSL1 is applied, drains coupled to local input/output line pair LD and LDB, respectively, and sources coupled to the first bit line pair BL and BL1B, respectively. That is, the column selection signal CSL1 is applied to the gate of the first column selection transistor 1411, while the drain is coupled to the local input/output line LD and the source is coupled to the first bit line BL1. The column selection signal CSL1 is also applied to second column selection transistor 1412, while the drain is coupled to the bar local input/output line LDB and the source is coupled to the first bar bit line BLB1.

Similarly, the second column transistor pair 1421 and 1422 includes gates to which a column selection signal CSL2 is applied, drains coupled to local input/output line pair LIO and LIOB, respectively, and sources coupled to the second bit line pair BL2 and BL2B, respectively. The n-th column transistor pair 1431 and 1432 includes gates to which a column selection signal CSLn is applied, drains coupled to local input/output line pair LIOn and LIOnB, respectively, and sources coupled to the n-th bit line pair BLn and BLnB, respectively.

Figure 4:
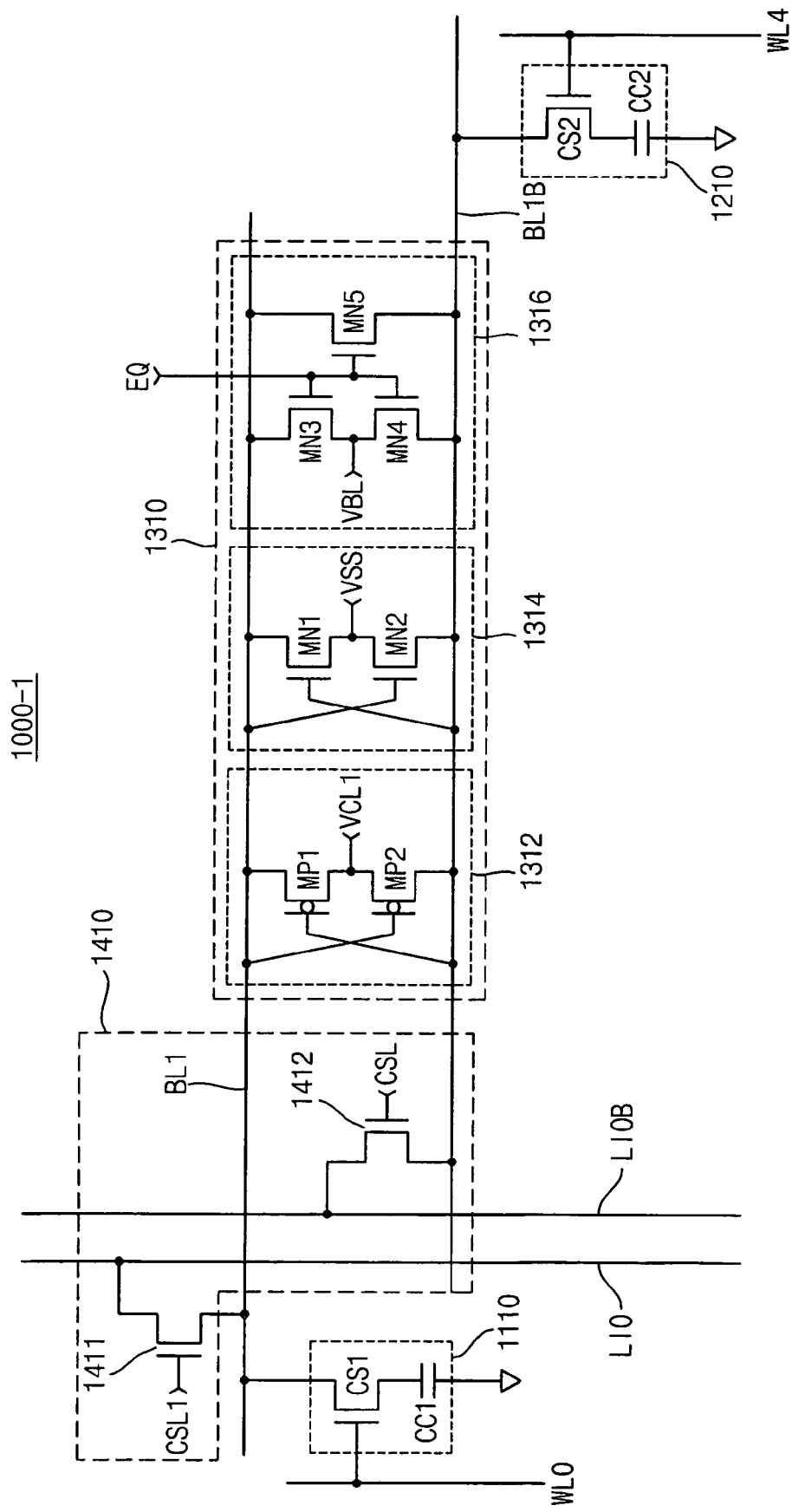
FIG. 4 is a circuit diagram illustrating an embodiment of a part of the memory core in FIG. 3.

FIG. 4 is a circuit diagram illustrating a part of the memory core in FIG. 3.

Referring to FIG. 4, the part of the memory-core 1000-1 includes the first memory cell 1110, the second memory cell 1210, the bit line amplification circuit 1310 and the column selection circuit 1410.

The bit line amplification circuit 1310 includes a P-type sense amplifier 1312, an N-type sense amplifier 1314 and an equalization circuit 1316.

The equalization circuit 1316 respectively pre-charges the bit line pair BL and BL1B with a voltage VBL. For example, the voltage VBL can correspond to a half power voltage VCC or a power voltage VCC.

The P-type sense amplifier 1312 charges the first bit line BL1 or the first bar bit line BL1B with a voltage VCL, and the N-type sense amplifier charges the first bit line BL1 or the first bar bit line BL1B with a voltage VSS. For example, the voltage VCL can correspond to a power voltage and the voltage VSS can correspond to a ground voltage.

The column selection transistors 1411 and 1412 electrically couple the bit line pair BL and BL1B to the local input/output line pair LIO and LIOB, respectively, in response to the column selection signal CSL1. That is, the first column selection transistor 1411 electrically couples the first bit line BL1 to the local input/output line LD in response to the column selection signal CSL1 and the second column selection transistor 1412 electrically couples the first bar bit line BL1B to the bar local input/output line BL1B in response to the column selection signal CSL1.

The first memory cell 1110 includes a first cell switch CS1 and a first cell capacitor CC1. The second memory cell 1210 includes a second cell switch CS2 and a second cell capacitor CC2. For example, the first and the second cell switches CS1 and CS2 can be configured with an NMOS transistor.

A memory core operation of a DRAM device in FIGS. 3 and 4 will be described as follows.

The first sub-memory array 1100 is arranged on the left side of the bit line amplification unit 1300 and is respectively coupled to the bit line amplification circuits 1310, 1320 and 1330 through the bit lines BL1, BL2 and BLn. That is, the first sub-memory array 1100 is coupled to the first bit line amplification circuit 1310 through the first bit line BL1, coupled to the second bit line amplification circuit 1320 through the second bit line BL2, and coupled to the third bit line amplification circuit 1330 through the n-th bit line BLn.

The first sub-memory array 1100 can output data in the memory cells to one of the bit line pairs BL and BL1B, BL2 and BL2B and BLn and BLnB and can store data on one of the bit line pairs BL and BL1B, BL2 and BL2B, and BLn and BLnB into the memory cells.

For example, when the word line WL0 is active, the first sub-memory array 1100 can output data in the first memory cell 1110 to the first bit line BL1 or store data on the first bit line BL1 into the first memory cell 1110. Similarly, when the word line WL4 is active, the second memory array 1200 can output data in the second memory cell 1210 to the first bar bit line BL1B or store data on the first bar bit line BL1B into the second memory cell 1210.

Referring to FIG. 4, the first bit line pair BL and BL1B are pre-charged and equalized by the equalization circuit 1316. Data on the first bit line pair BL and BL1B are amplified by the P-type sense amplification amplifier 1312 and the N-type sense amplifier 1314. The data on the first bit line pair BL and BL1B are respectively provided to the local input/output line pair LIO and LIOB through the first column selection circuit 1410.

The first column selection circuit 1410 in the column selection unit 1400 includes the first column selection transistor 1411 and the second column selection transistor 1412, and the column selection transistors 1411 and 1412 are arranged on the left side of the bit line amplification circuit 1310. That is, the column selection transistors 1411 and 1412 are physically closely arranged. Therefore, a data error due to the distance mismatching can be reduced. In the conventional memory core in FIG. 1, a data error due to the distance mismatching can occur because the column selection transistors 20 and 30 are respectively arranged on opposite sides of the bit line amplification circuit 1310.

In the above description, the column selection unit 1400 is arranged between the first sub-memory array 1100 and the bit line amplification circuit 1300. However, the column selection unit 1400 can be arranged between the second sub-memory 1400 and the bit line amplification circuit 1300 in other embodiments. That is, the column selection unit 1400 can be freely arranged within the memory core 1000.

Also, in FIG. 4, the column selection transistors 1411 and 1412 included in the column selection circuit 1410 are closely arranged and, in other embodiments, the column selection circuit 1410 can be arranged between the P-type sense amplifier 1312 and the N-type sense amplifier 1314. That is, when a layout of a semiconductor is designed, the column selection circuit 1410 can be physically disposed between the P-type sense amplifier 1312 and the N-type sense amplifier 1314.

Furthermore, arrangements of the P-type sense amplifier 1312 and the N-type sense amplifier 1314 can be changed.

That is, the N-type sense amplification circuit 1314 can be arranged on a left side of the P-type sense amplification 1312.

The column selection transistors 1411 and 1412 included in the column selection circuit 1410 are closely arranged and therefore, the column selection circuit 1410 can be arranged between the P-type sense amplifier 1312 and the equalization circuit 1316 or between the N-type sense amplifier 1314 and the equalization circuit 1316. That is, because the column selection transistors 1411 and 1412 included in the column selection circuit 1410 are closely arranged, the column selection circuit 1410 can be freely arranged in the memory core.

Figure 5:
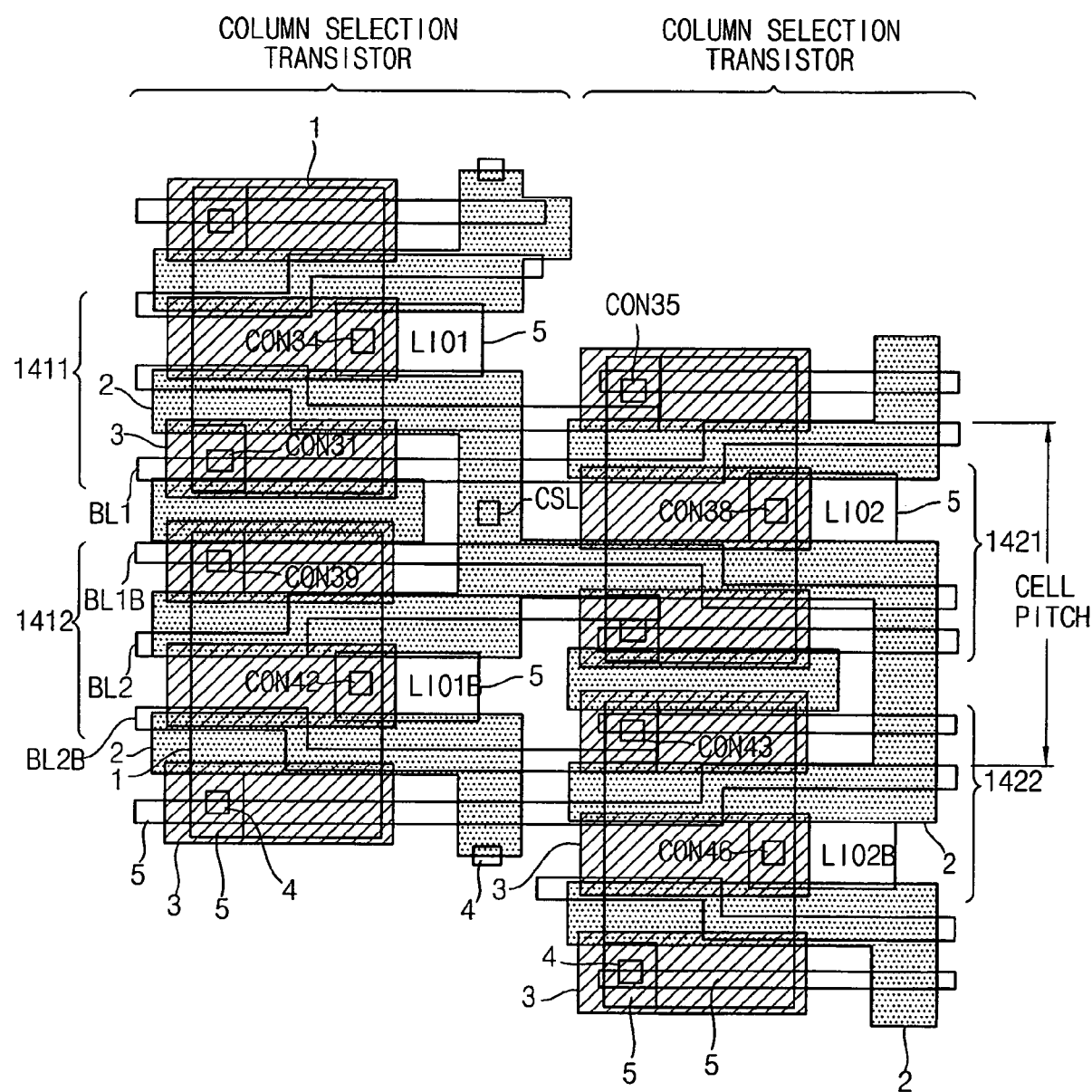
FIG. 5 is a layout diagram illustrating an embodiment of a part of the column selection unit in the memory core in FIG. 3.

FIG. 5 is a layout diagram illustrating a part of the column selection unit in the memory core in FIG. 3. Referring to FIG. 5, the column selection unit 1400 includes an N+ doped layer 1, a gate poly (GP) layer 2, a self-aligned contact (SAC) poly layer 3, a direct contact (DC) layer 4, and a bit line poly (BP) layer 5. The second part of the memory core employs the open bit line architecture with two bit line pairs BL and BL1B and BL2 and BL2B. The bit line amplification unit 1300 (not shown in FIG. 5) can be arranged on either side of the column selection unit 1400.

The first and the second column selection transistors 1411 and 1412 respectively output data on the bit line pair BL and BL1B to first local input/output line pair LIO1 and LIO1B in response to the column selection signal CSL. Namely, the first column selection transistor 1411 outputs the data on the first bit line BL1 to the first local input/output line LIO1 in response to the column selection signal, and the second column selection transistor 1412 outputs the data on the first bar bit line BL1B to the first bar local input/output line LIO1B in response to the column selection signal.

In FIG. 5, a first contact CON31 indicates a source contact of the first column selection transistor 1411, and a second contact CON34 indicates a drain contact of the first column selection transistor 1411. A third contact CON35 indicates a source contact of the third column selection transistor 1421, and a fourth contact CON38 indicates a drain contact of the third column selection transistor 1421.

A fifth contact CON39 indicates a source contact of the second column selection transistor 1412, and a sixth contact CON42 indicates a drain contact of the second column selection transistor 1412. A seventh contact CON43 indicates a source contact of the fourth column selection transistor 1422, and a eighth contact CON46 indicates a drain contact of the fourth column selection transistor 1422.

Figure 2:
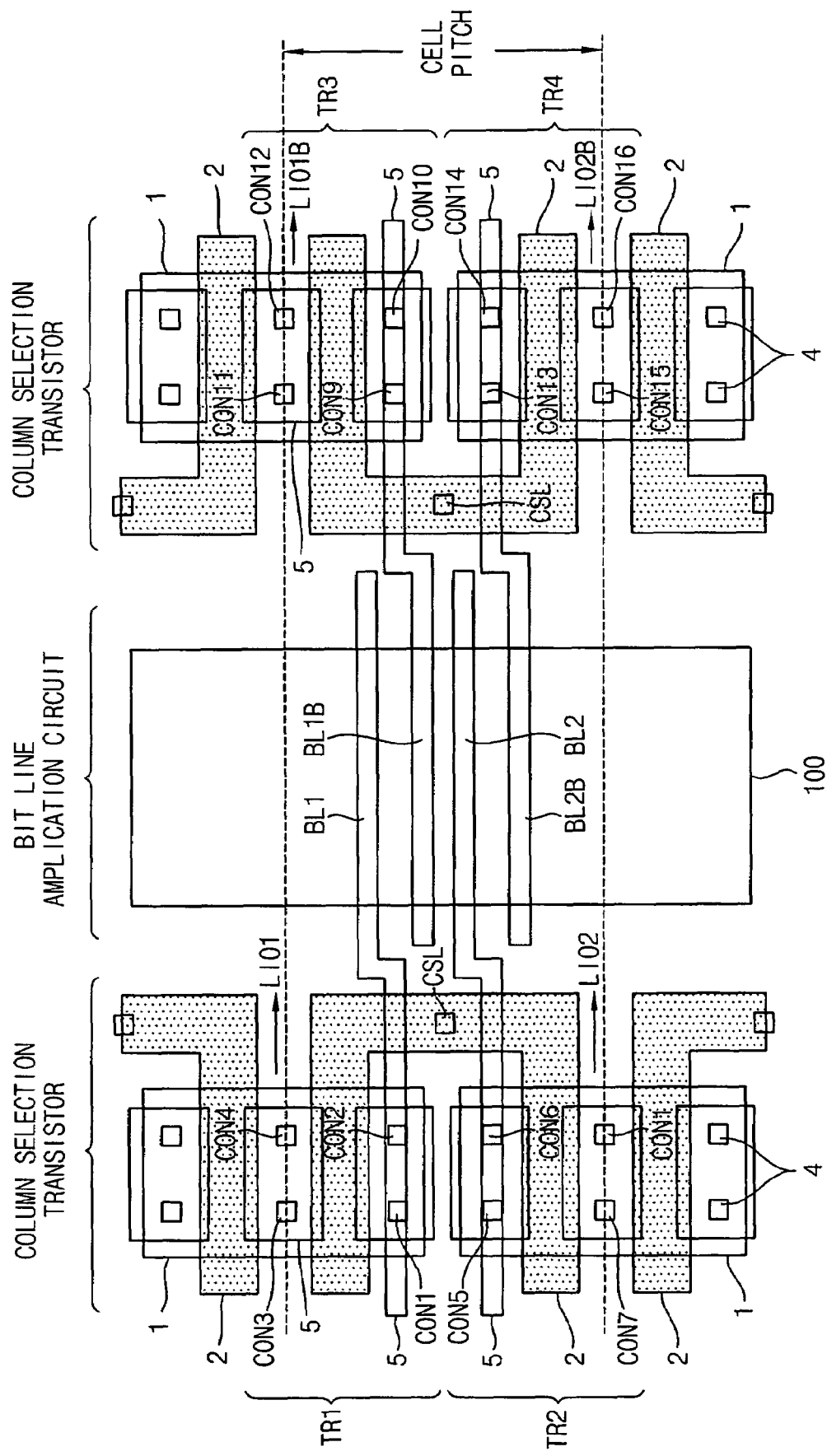
FIG. 2 is a layout diagram illustrating a conventional memory core in the semiconductor memory device in FIG. 1.

Unlike the conventional column selection transistors TR1 through TR4 in FIG. 2 in which a source area and a drain area of the column selection transistors TR1 through TR4 each have two contacts, the column selection transistors 1411 through 1422 in FIG. 5 each include a single contact in a source area and a drain area of the column selection transistors 1411 through 1422. Unlike to the conventional column selection transistors TR1 through TR4, the column selection transistors 1411 through 1422 operate correctly with the single contact approach because the SAC poly layer 3 performing a contact function entirely covers the source area and the drain area of the column selection transistors 1411 through 1422.

In the illustrative embodiments, because each of the column selection transistors 1411 through 1422 includes the only one contact in the source area and the drain area, the two bit line pairs BL and BL1B, and BL2 and BL2B can pass the column selection transistors 1411 through 1422 in widthwise cross section.

For example, the source contact CON31 of the first column selection transistor 1411 electrically couples the source area of the first column selection transistor 1411 to the first bit line BL1, and the contact CON34 of the first column selection transistor 1411 electrically couples the drain area of the first selection transistor 1411 to the first local input/output line LIO1. The first bit line BL1 can be formed between the source contact CON31 and the drain contact CON34, because the only one contact is respectively formed in the source area of the first column selection transistor 1411 and the drain area of the first column selection transistor 1411.

Similarly, the source contact CON39 of the second column selection transistor 1412 electrically couples the source area of the second column selection transistor 1412 to the first bar bit line BL1B, and the drain contact CON42 of the second column selection transistor 1412 electrically couples the drain area of the second column selection transistor 1412 to the first bar local input/output line LIO1B. The second bar bit line BL2B can be formed between the source contact CON39 and the drain contact CON42, because the only one contact is respectively formed in the source area of the second column selection transistor 1412 and the drain area of the second column selection transistor 1412.

Therefore, in the memory core of FIG. 5, the first column selection transistor 1411 coupled to the first bit line BL1, the second column selection transistor 1412 coupled to the first bar bit line BL1B, the third column selection transistor 1421 coupled to the second bit line BL2 and the fourth column selection transistor 1422 coupled to the second bar bit line BL2B are physically closely arranged.

Referring to FIG. 2, and in contrast to the above illustrative embodiment, the first column selection transistor TR1 which amplifies the first bit line BL1 and the third column selection transistor TR3 which amplifies the first bar bit line BL1B must be arranged in either side of the bit line amplification circuit 100, because the two bit line pairs BL and BL1B, and BL2 and BL2B can not pass in the cell pitch area.

However, in FIG. 5, the two bit lines pairs BL and BL1B, and BL2 and BL2B can pass in the cell pitch area. Therefore, the column selection transistor pair 1411 and 1412 can be arranged freely within the memory core. Additionally, the data error due to the distance mismatching can be reduced.

Figure 6:
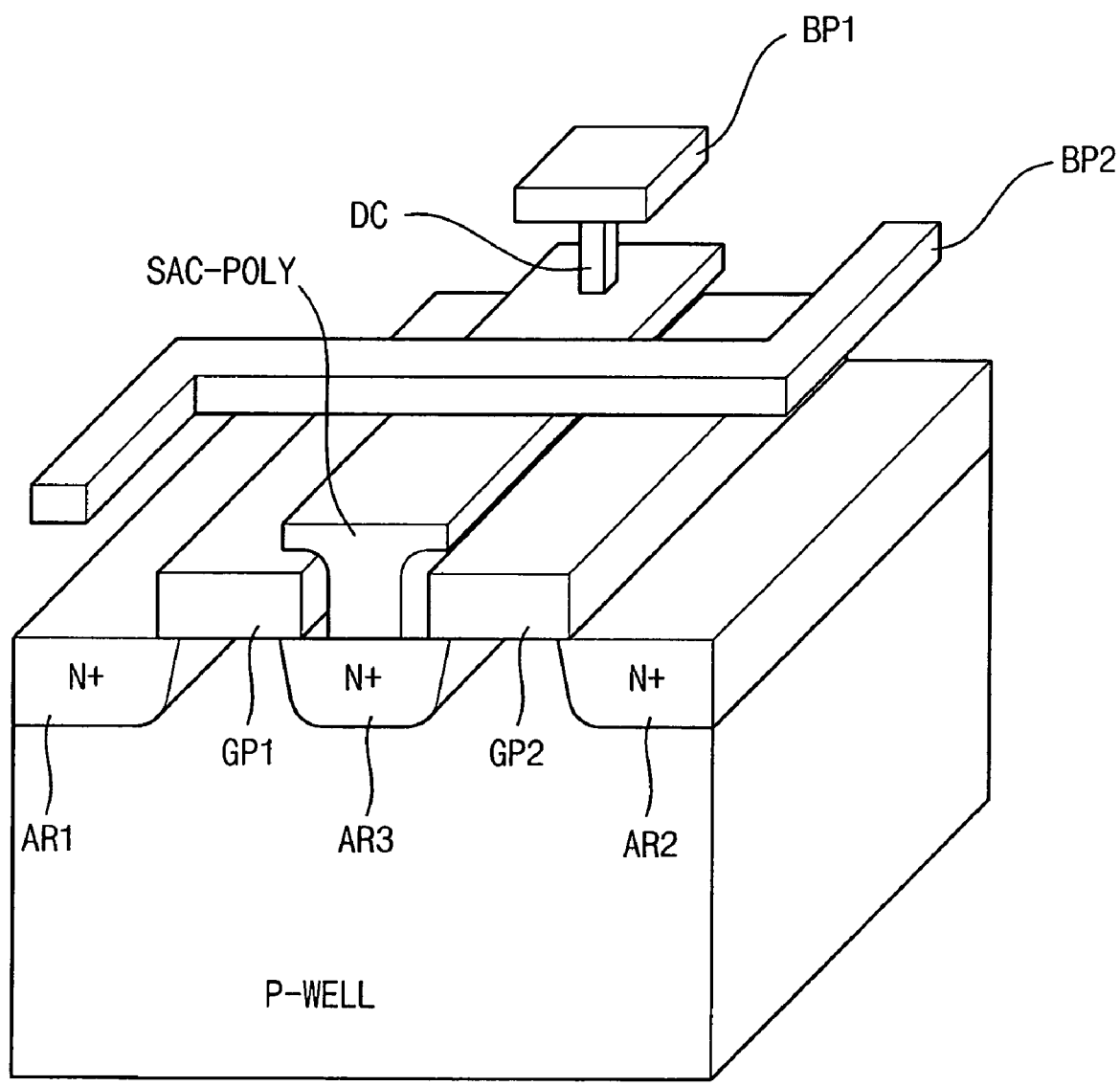
FIG. 6 is a sectional view illustrating an example embodiment of the column selection transistor in FIG. 5.

FIG. 6 is a sectional view illustrating an example embodiment of the column selection transistor in FIG. 5.

In FIG. 6, a first N+ doped area AR1 and a second N+ doped area AR2 respectively indicate a source area, and a third N+ doped area AR3 indicates a common drain area. A first gate poly layer GP1 and a second gate poly layer GP2 respectively indicate a gate area. A self-aligned contact poly layer SAC-POLY between the first gate poly GP1 and the second gate poly GP2 indicates a contact poly. A first bit line poly BP1 and a second bit line poly BP2 on a direct contact layer DC respectively indicate a bit line poly.

Referring to FIG. 6, the self-aligned contact poly SAC-POLY covers substantially the whole area of the drain area and makes contact with the common drain area AR3. Therefore, although only one direct contact DC is formed on the self-aligned contact poly SAC-POLY, a first MOS transistor configured with the first source area AR1, the drain area AR3 and the first gate area GP1 operates normally. Additionally, a second MOS transistor configured with the second source area AR2, the drain area AR3 and the second gate area GP operates normally.

Because the column selection transistor forms only one direct contact DC on the upper area of the self-aligned contact poly SAC-POLY, the second bit line poly BP2 as well as the first bit line poly BP1 for outputting data to a local input/output line can be arranged on the upper area of the column selection transistor.

Figure 7:
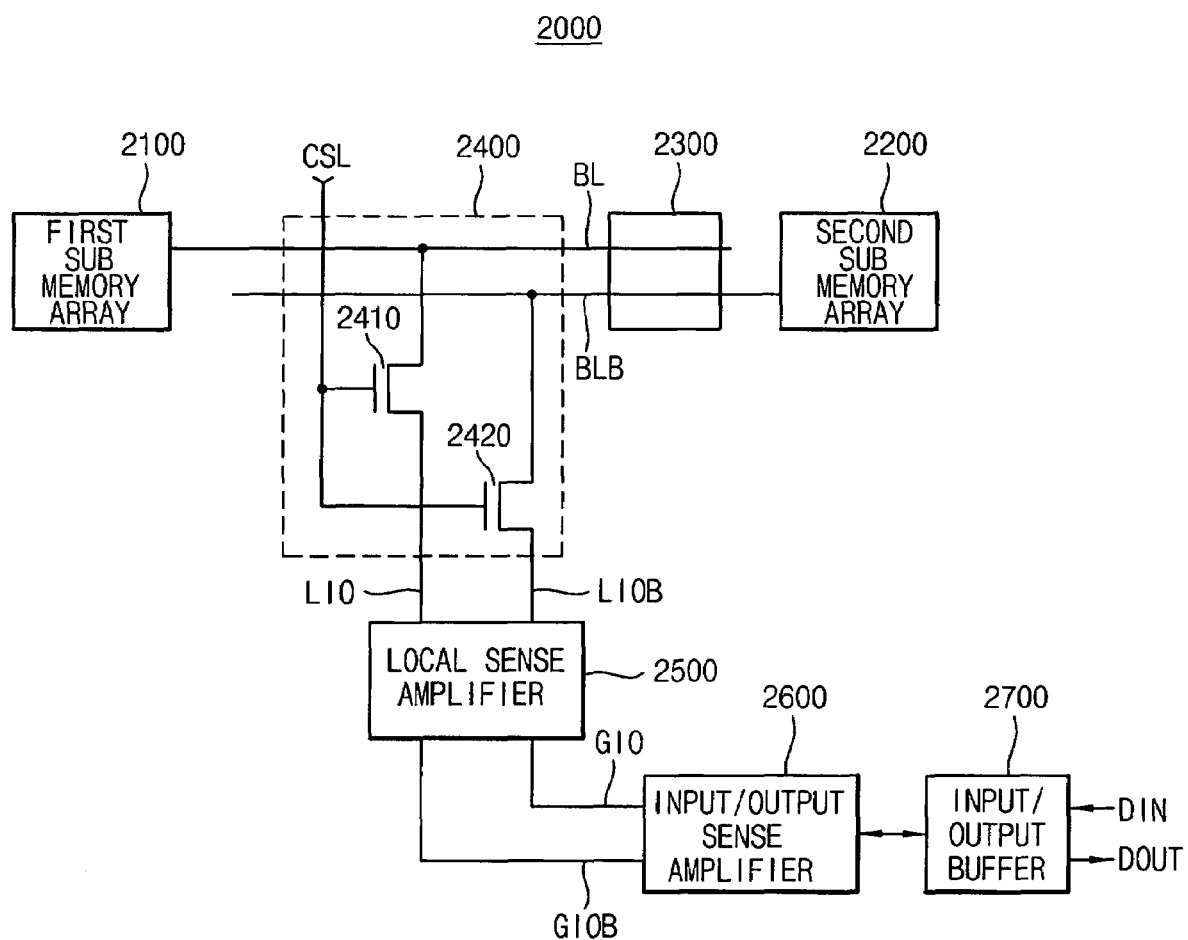
FIG. 7 is a block diagram illustrating an example embodiment of a DRAM device to which the memory core in FIG. 3 is applied.

FIG. 7 is a block diagram 2000 illustrating an example embodiment of a DRAM device to which the memory core in FIG. 3 can be applied.

Referring to FIG. 7, the DRAM device includes a first sub-memory array 2100, a second sub-memory array 2200, a bit line amplification circuit 2300, a column selection circuit 2400, a local sense amplifier 2500, an input/output sense amplifier 2600, and an input/output buffer 2700.

Hereinafter, the operation of the DRAM device as shown in FIG. 7 will be described.

The bit line amplification circuit 2300 is coupled to the sub-memory arrays 2100 and 2200 through a bit line pair BL and BLB. The column selection circuit 2400 outputs data on the bit line pair BL and BLB to a local input/output line pair LIO and LIOB, respectively, in response to a column selection signal CSL.

The data on the local input/output line pair LIO and LIOB are amplified by the local sense amplifier 2500 and the input/output sense amplifier 2600. The input/output buffer 2700 buffers an output of the input/output sense amplifier 2600 to output a buffered data DOUT. Additionally, the input/output buffer 2700 buffers an input data DIN to input the buffered data to the memory core through the input/output sense amplifier 2600 and the local sense amplifier 2500.

As illustrated in FIG. 7, the column selection circuit 2400 is arranged between the bit line amplification 2300 and the first sub-memory array 2100. Therefore, a distance between a first column selection transistor 2410 and the bit line amplification circuit 2300 and a distance between a second column selection transistor 2420 and the bit line amplification circuit 2300 are substantially equivalent. As a result, a data error due to the distance mismatching can be reduced. In other embodiments, the column selection circuit 2400 can be arranged between the bit line amplification circuit 2300 and the second sub-memory array.

As described above, the memory core in the semiconductor memory device according to above example embodiments of the present disclosure can reduce the number of contacts that electrically couple the bit line and the local input/output line by using the self-aligned contact poly and can arrange the column selection circuits adjacently.

Therefore, the memory core in the semiconductor memory device according to the above example embodiments can physically arrange the column selection circuits in any place within the memory core and can reduce the data error caused by distance mismatching.

While the foregoing has described what are considered to be the best mode and/or other preferred embodiments, it is understood that various modifications may be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A memory core employing an open bit line architecture, comprising:
   a plurality of first bit lines;
   a plurality of second bit lines, the second bit lines having a complementary relationship with the first bit lines;
   a first sub-memory array having a plurality of first memory cells configured to output first data into the first bit lines in response to a first word line control signal;
   a second sub-memory array having a plurality of second memory cells configured to output second data into the second bit lines in response to a second word line control signal, the second data having a complementary relationship with the first data;

a bit line amplification circuit configured to amplify the first data on the first bit lines and the second data on the second bit lines; and a column selection circuit including a first column selection transistor configured to electrically couple the first bit lines to a first input/output line in response to a column selection signal and a second column selection transistor configured to electrically couple the second bit lines to a second input/output line having a complementary relationship with the first input/output line, the first and second column selection transistors being arranged between the bit line amplification circuit and the first sub-memory array, each of the first and second column selection transistors including a first single contact formed on a source area of the first and second column selection transistors and a second single contact on a drain area of the first and second column selection transistors, the first single contact being connected to one of the first and second bit lines, the second single contact being connected to one of the first and second input/output lines.

2. The memory core of claim 1, wherein in the first and second column selection transistors, a self-aligned contact (SAC) poly layer is formed on substantially a whole surface of the drain area of the first and second column selection transistors.

3. The memory core of claim 1, wherein the bit line amplification circuit comprises:

a P-type sense amplifier configured to charge the first and second bit lines with a high power voltage; and an N-type sense amplifier configured to charge the first and second bit lines with a low power voltage.

4. The memory core of claim 3, wherein the bit line amplification circuit further comprises an equalization circuit configured to pre-charge and equalize the first and second bit lines.

5. A semiconductor memory device comprising:

a memory core configured to amplify data stored in a memory cell, to output the amplified data to a local input/output line, and to store the data on the local input/output line, wherein the memory core comprises:

a plurality of first bit lines;

a plurality of second bit lines, the second bit lines having a complementary relationship with the first bit lines;

a first sub-memory array having a plurality of first memory cells configured to output first data into the first bit lines in response to a first word line control signal;

a second sub-memory array having a plurality of second memory cells configured to output second data into the second bit lines in response to a second word line control signal, the second data having a complementary relationship with the first data;

a bit line amplification circuit configured to amplify the first data on the first bit lines and the second data on the second bit lines;

a column selection circuit including a first column selection transistor configured to electrically couple the first bit lines to a first input/output line in response to a column selection signal and a second column selection transistor configured to electrically couple the second bit lines to a second input/output line having a complementary relationship with the first input/output line, the column selection circuit being arranged between the bit line amplification circuit and the first sub-memory array, each of the first and second column selection transistors including a first single contact formed on a source area of the first and second column selection transistors and a second single contact on a drain area of the first and second column selection transistors, the first single contact being connected to one of the first and second bit lines, the second single contact being connected to one of the first and second input/output lines; and a local sense amplifier configured to amplify the data outputted from the memory core and to output the amplified data.

6. The memory core of claim 5, wherein in the first and second column selection transistors, a self-aligned contact (SAC) poly layer is formed on substantially a whole surface of the drain area of the first and second column selection transistors.

* * * * *